Figure 1:
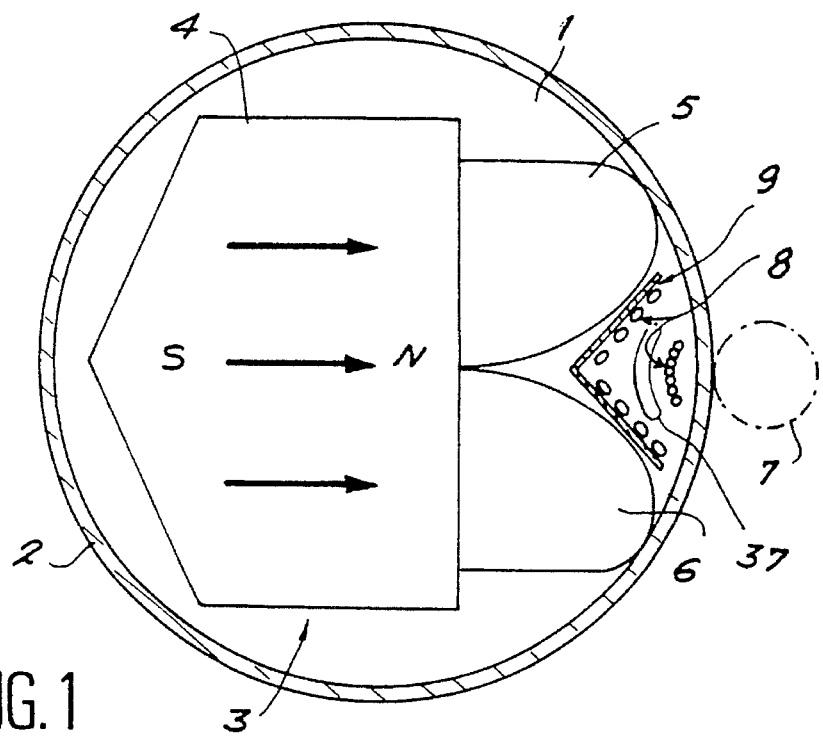

United States Patent [19]

Locatelli et al.

[11] Patent Number: 5,610,522
[45] Date of Patent: Mar. 11, 1997

[54] OPEN MAGNETIC STRUCTURE INCLUDING POLE PIECES FORMING A V-SHAPE THREBETWEEN FOR HIGH HOMOGENEITY IN AN NMR DEVICE

[75] Inventors: Marcel Locatelli, Montbonnot; Christian Jeandey, Egreve, both of France

[73] Assignee: Commissariat a l'Energie Atomique, Paris, France

[21] Appl. No.: 312,075

[22] Filed: Sep. 26, 1994

[30] Foreign Application Priority Data

Sep. 30, 1993 [FR] France ................................. 93 11673

[51] Int. Cl.⁶ ..................... G01R 33/383; G01R 33/38
[52] U.S. Cl. ............................ 324/319; 324/300
[58] Field of Search .................... 324/300, 303, 324/307, 316, 318, 319, 320, 321; 128/653.2, 653.3

[56] References Cited

U.S. PATENT DOCUMENTS

| | | |
|---|---|---|
| 4,350,955 | 9/1982 | Jackson et al. |
| 4,644,313 | 2/1987 | Miyajima. |
| 4,710,713 | 12/1987 | Strikman. |
| 4,717,876 | 1/1988 | Masi et al. |
| 4,717,878 | 1/1988 | Taicher et al. |
| 4,841,249 | 6/1989 | Duerr et al. |
| 4,933,638 | 6/1990 | Kenyon et al. |
| 4,968,937 | 11/1990 | Akgun ..................... 324/318 |
| 4,998,976 | 3/1991 | Rapoport ................. 324/318 |
| 5,063,934 | 11/1991 | Rapoport et al. ..................... 128/653.5 |
| 5,095,271 | 3/1992 | Ohkawa. |
| 5,320,103 | 6/1994 | Rapoport et al. ..................... 128/653.5 |
| 5,400,786 | 3/1995 | Allis ..................... 128/653.2 |
| 5,431,165 | 7/1995 | Sellers ..................... 128/653.5 |

FOREIGN PATENT DOCUMENTS

| | | |
|---|---|---|
| 0268083A1 | 5/1988 | European Pat. Off. . |
| 0371775A3 | 6/1990 | European Pat. Off. . |
| WO92/07279 | 4/1992 | WIPO . |
| WO92/10768 | 6/1992 | WIPO . |

*Primary Examiner*—Sandra L. O'Shea
*Assistant Examiner*—Roger Phillips
*Attorney, Agent, or Firm*—Burns, Doane, Swecker & Mathis, LLP

[57] ABSTRACT

The disclosure relates to an open magnetic structure for producing an intense, stable magnetic field, which is amplitude and direction-controlled in a region adjacent to said structure, having at least one magnetic source (4) for producing said magnetic field, characterized in that it also comprises at least one pole piece (5, 6) associated with the magnetic source and having a shape designed so as to control the magnetic field produced.

Application to petroleum or oil research in drilled wells and to surface magnetic imaging.

23 Claims, 5 Drawing Sheets

OPEN MAGNETIC STRUCTURE INCLUDING POLE PIECES FORMING A V-SHAPE THREBETWEEN FOR HIGH HOMOGENEITY IN AN NMR DEVICE

The present invention relates to open magnetic structures for producing magnetic fields and making it possible, within a given volume, to control, check or monitor the magnetic field, particularly for providing it with a given homogeneity or uniformity. Such magnetic structures are said to be open in order to bring about a differentiation from structures in which the useful volume (i.e. the volume in which there is a given homogeneity of the magnetic field) is largely surrounded by the magnetic structure.

Such open magnetic structures have widely varying applications. They are in particular used in devices employing nuclear magnetic resonance (NMR) phenomena, or electron paramagnetic resonance (EPR) phenomena. These devices can be used in scientific research, medicine, the food industry, non-destructive testing, as well as mining and petroleum research.

In the latter field numerous configurations of open magnetic structures have been proposed and are described in the following documents: U.S. Pat. No. 4,933,638 (Kenyon et al), WO 92/10768 (Miller), U.S. Pat. No. 4,717,878 (Taicher et al), U.S. Pat. No. 4,710,713 (Strikman) and U.S. Pat. No. 4,350,955 (Jackson et al). These structures use electromagnets or permanent magnets as the magnetic source. The homogeneity of the desired magnetic field in a given volume is obtained by the particular distribution and the geometry of the sources.

Thus, it is possible to generate in a region of a geological layer a uniform, static magnetic field and excite the nuclei of the atoms of said region by an electromagnetic signal transmitted by means of an antenna. A receiver connected to the antenna, or the antenna used as a receiver, makes it possible to collect the signals reflected by the atoms. The collected signals reveal certain properties of the examined layer (porosity/permeability).

A disadvantage of such open magnetic structures is that the homogeneity or uniformity of the magnetic field is obtained by the particular distribution of the sources and their geometry. In order to obtain a good homogeneity, the magnetic sources must be remote from the volume to be observed. Thus, with respect to the energy efficiency, they cannot be used in an optimum manner. The magnetic induction obtained is weak, whereas the observation volume is large. For example, for a diameter 100 mm well, a 1.2 T, Sm-Co permanent magnet permits an observation volume of a few $dm^3$ and the magnetic induction in this volume is approximately 0.024 T.

The present invention makes it possible to obviate this disadvantage. Unlike in the prior art, the control of the magnetic field and, if appropriate, its homogeneity, is obtained on the basis of a magnetic circuit having pole pieces. This solution has the advantage of separating the source and control functions of the magnetic field in amplitude and direction in the observation volume. This permits a better optimization of the structure than in the prior art devices, particularly due to the constraint with respect to the available space as is the case in well logging (constraint due to the geometry and dimensions of the well). This makes it possible to obtain higher magnetic inductions (by moving together the poles and the magnetic sources) and also of a better controlled nature, so that in NMR there is a higher signal-to-noise ratio. The usable magnetic sources can be electromagnets or permanent magnets.

In the aforementioned example of the drilled well, the magnetic induction obtained by a structure according to the invention is 0.1 T. This result could be obtained if it was possible to manufacture a magnetic source not only having a geometry of the magnet as at the examined volume level, the magnet being against the well walls, but also a controlled amplitude and direction magnetization distribution, which could give rise to magnet machining problems. It is also very difficult to envisage obtaining a controlled magnetization by the bonding of magnetized material with different magnetization directions.

The invention therefore relates to an open magnetic structure for producing an intense, stable magnetic field, which is amplitude and direction-controlled in a region adjacent to said structure, having at least one magnetic source for producing said magnetic field, characterized in that it also comprises at least one pole piece associated with the magnetic source and having a shape designed so as to control the magnetic field produced.

The structure can comprise at least one pole piece per pole of the magnetic source and referred to as the main pole piece. The main pole piece for controlling the magnetic field produced can have a hollow portion constituting a generally V-shaped space, said region subject to the controlled magnetic field being positioned facing the opening of the V.

The structure can have two aligned magnetic sources, two poles of the same nature facing one another and each of the said two poles being provided with a pole piece known as the internal main pole piece for producing said controlled magnetic field, a V-shaped space separating said internal main pole pieces, said region subject to the controlled magnetic field being located facing the opening of the V.

The structure can have at least one auxiliary magnetic source with at least one pole piece, the assembly being placed within the V defined by the main pole pieces facing the region subject to the controlled magnetic field.

The invention also relates to a device permitting the analysis of a given region by means of magnetic fields, characterized in that it comprises a structure like that defined hereinbefore for producing an intense, static and homogeneous magnetic field in said given region, and means permitting the emission of an electromagnetic signal towards said given region and the reception of the response signal from said given region to the emitted signal.

For a use as a surface magnetic imaging device, it can comprise, in the V-shaped space, gradient coils for the directions in space x, y and possibly z, z being the direction of the controlled magnetic field in the given region.

The invention is described in greater detail hereinafter relative to a non-limitative embodiment and with reference to the attached drawings, wherein show:

FIG. 1 Diagrammatically an open magnetic structure according to the invention.

Figure 2:
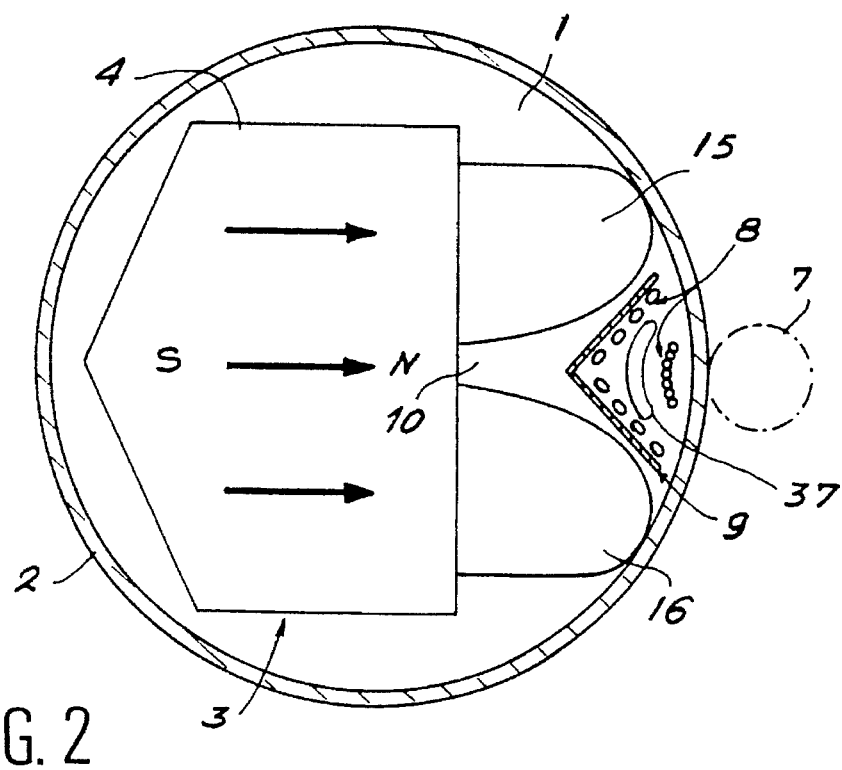

FIG. 2 A variant of the open magnetic structure of FIG. 1.

Figure 3:
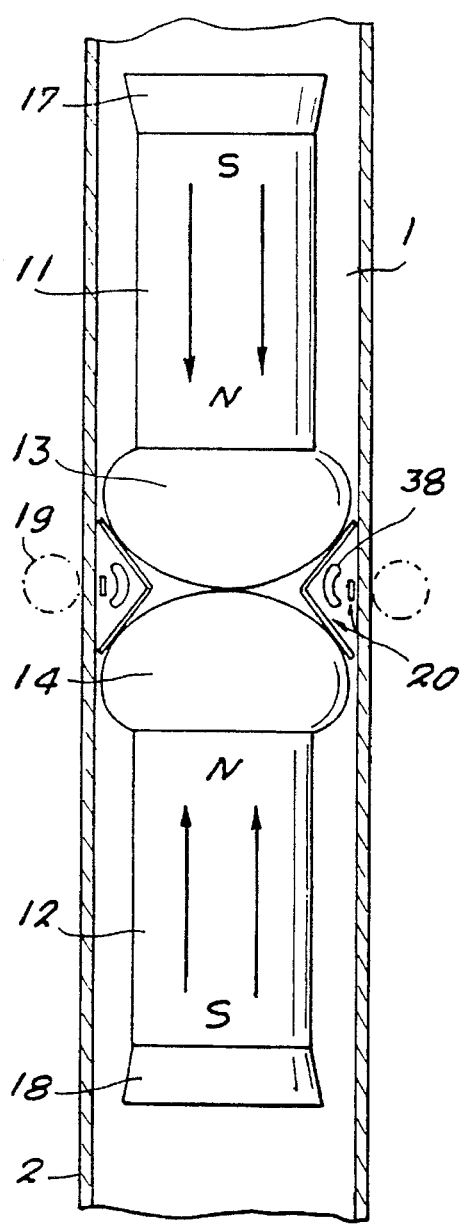

FIG. 3 Diagrammatically a first variant of the open magnetic structure with two magnetic sources according to the invention.

Figure 4:
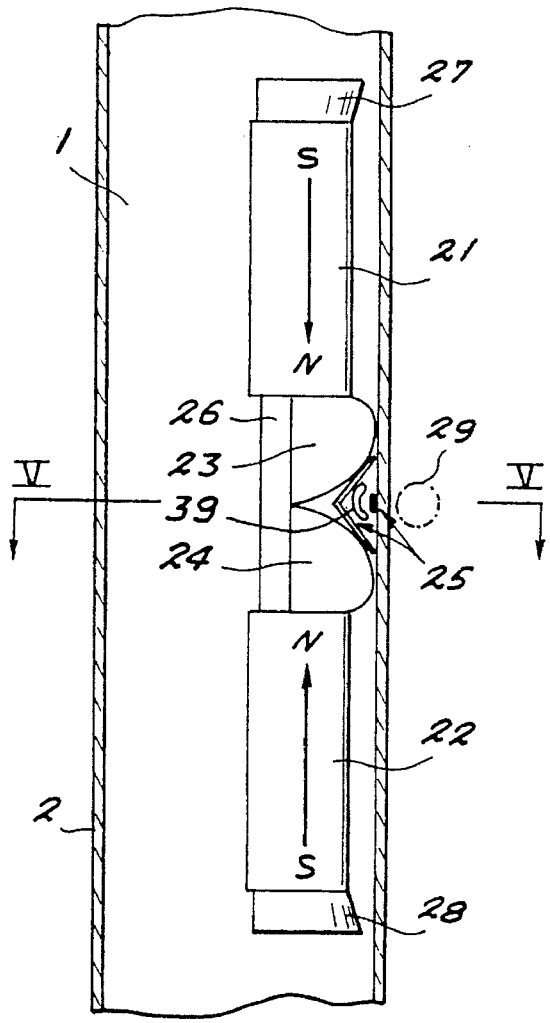

FIG. 4 Diagrammatically a second variant of the open magnetic structure with two magnetic sources according to the invention.

Figure 5:
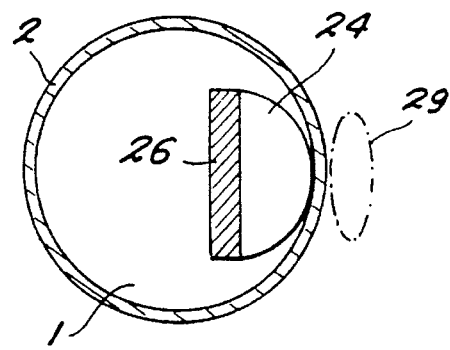

FIG. 5 A view along the section V—V of FIG. 4.

Figure 6:
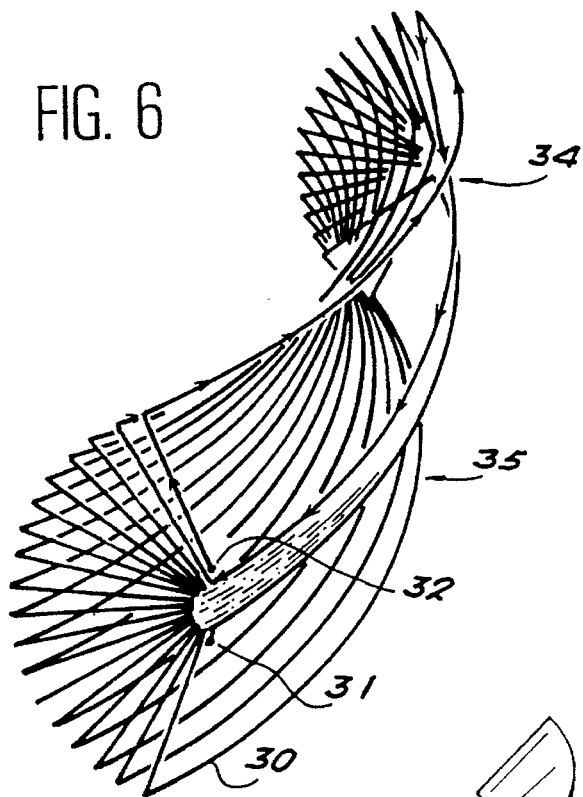

FIG. 6 A high frequency (h.f.) antenna usable for the open magnetic structures shown in the previous drawings.

Figure 7:
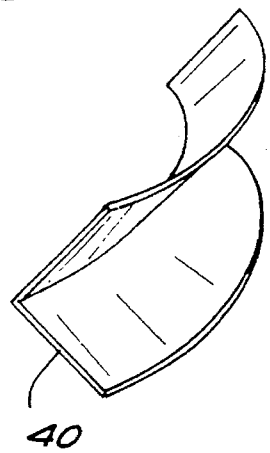

FIG. 7 An electromagnetic screen usable for an open magnetic structure according to the invention.

Figure 8:
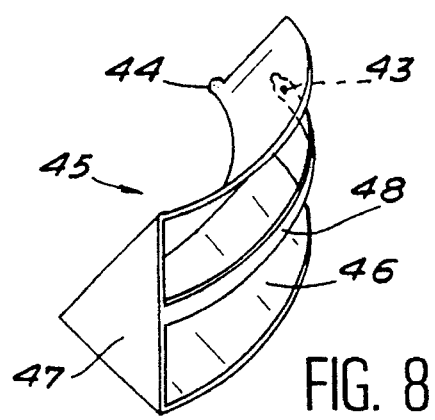

FIG. 8 A high frequency antenna usable for magnetic structures according to the invention.

Figure 9:
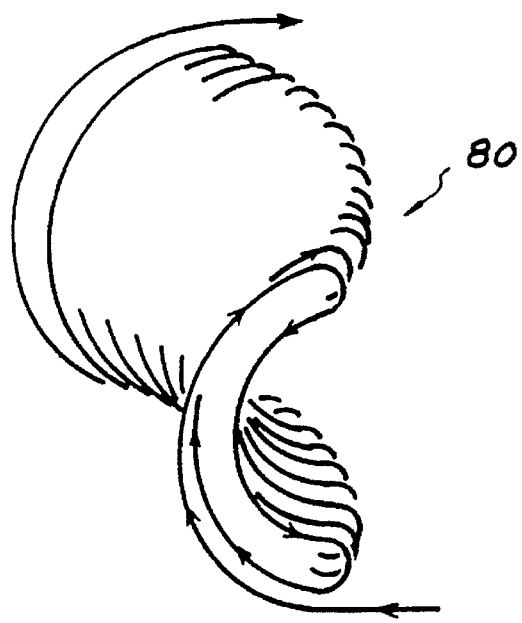

FIG. 9 A high frequency antenna usable for magnetic structures according to the invention.

Figure 10:
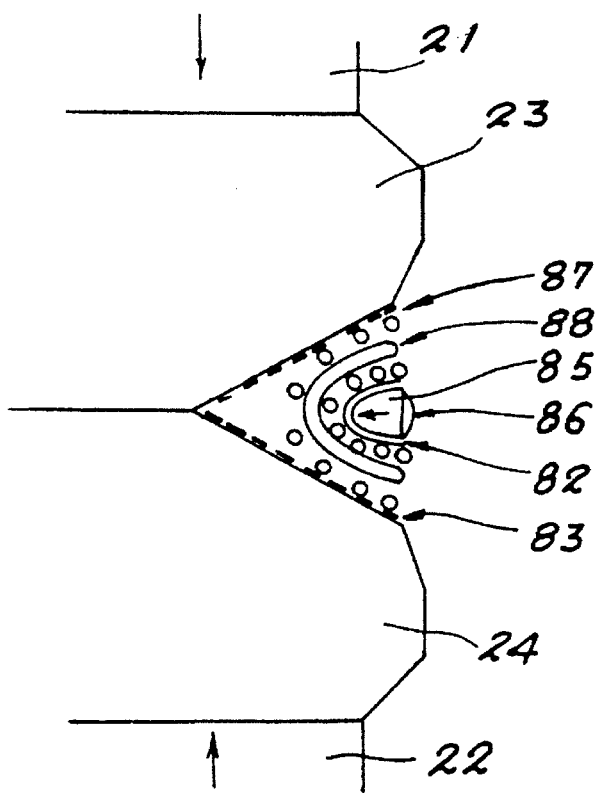

FIG. 10 A detail of an open magnetic structure according to the second variant having a supplementary magnetic source.

Figure 11:
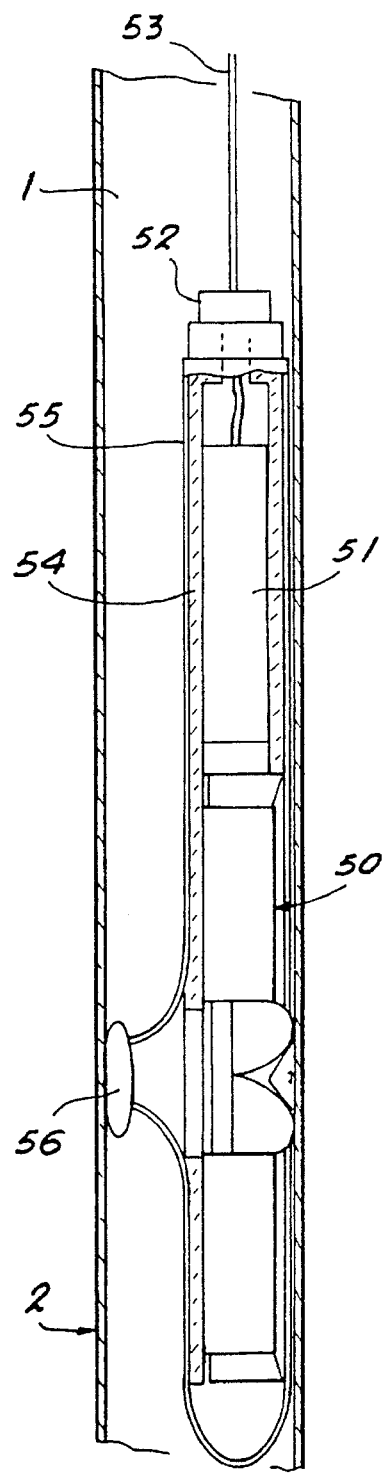

FIG. 11 A drilled well logging device.

Figure 12:
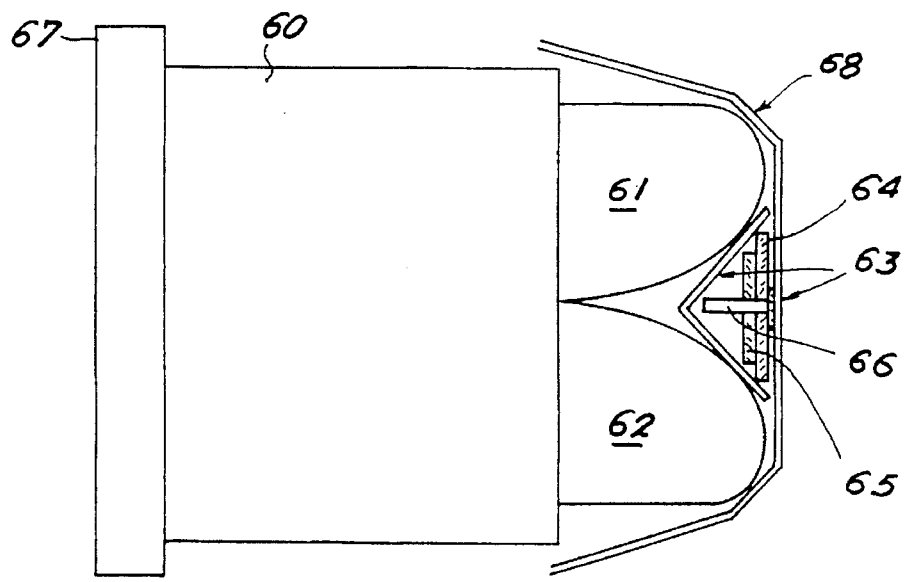

FIG. 12 A configuration for surface magnetic imagining according to the invention.

Figure 13:
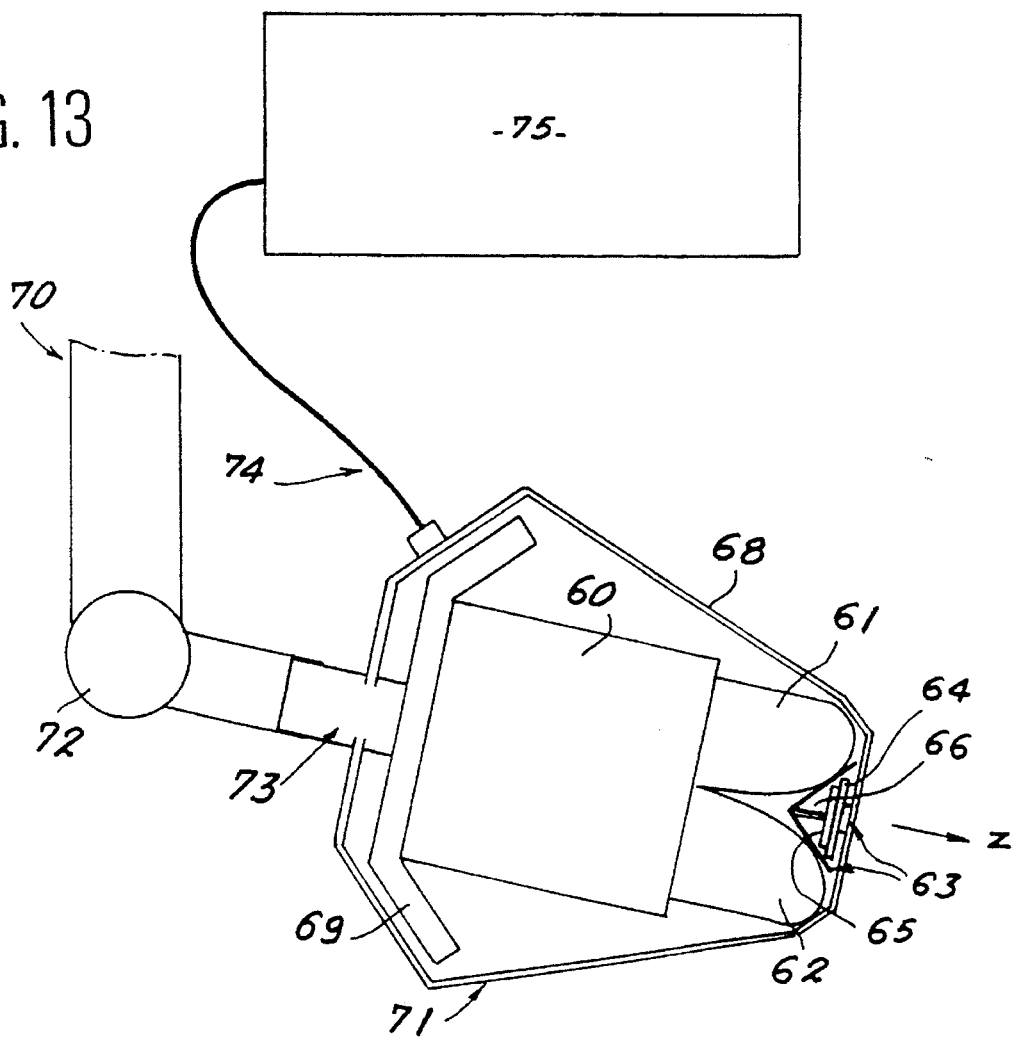

FIG. 13 A surface magnetic imager, whose head is shown in section according to the invention.

FIG. 1 shows an open magnetic structure according to the invention usable for oil or petroleum research. The structure is shown in cross-section along the vertical axis of the well 1, whereof the mud deposits on the inner wall of the well is represented by the reference numeral 2. The magnetic structure 3 comprises a magnetic source 4 and two pole pieces 5, 6 fixed to one of the poles of the magnetic source 4. The other pole of the magnetic source is left uncovered, but has a shape making it possible to fill the well 1 to the greatest possible extent.

This magnetic structure corresponds to an application for the measurement of the relaxation times of the protons of water or hydrocarbons with a view to the determination of the porosity and permeability of the ground. The magnetic source 4 is preferably constituted by samarium-cobalt permanent magnets able to withstand temperatures exceeding 200° C. The magnetization is perpendicular to the axis of the well. The homogeneous magnetic induction (a few percent) in the geological layer zone 7 is obtained as a result of the geometry of the pole pieces 5, 6 made from a soft magnetic material (soft iron, soft ferrite or silicon sheets). The thickness of the pole pieces along the axis of the well defines the thickness of the homogeneous zone 7 (useful volume).

For example, an induction of approximately 0.05 T with a homogeneity of approximately 1% can be produced in a region, whose centre is at a distance of 15 mm with respect to the interior of the geological formation. The homogeneous zone 7 constitutes a cylinder parallel to the axis of the well 1, having a diameter of 20 mm and a height of 300 mm for a well diameter of approximately 100 mm.

The different possible geometries for the pole pieces result from mathematical calculations and the experience of the skilled expert, whilst considering as a first approximation, that the free faces of the pole pieces are magnetic equipotentials.

Between the two pole pieces 5 and 6 and facing the zone 7 is provided an antenna 8 making it possible to transmit a high frequency, electromagnetic exciting signal to the nuclei of the atoms of said zone. The antenna 8 also makes it possible to detect the response of the nuclei to the exciting signal. It is also possible to use an antenna 37 of polarization in quadrature with that of the antenna 8, i.e. electromagnetically decoupled, but coupled to the useful signal of the nuclei, in the same way as the antenna 8. The presence of the pole pieces 5, 6 may disturb the h.f. signal passing through the antenna or antennas. This disturbance leads to the appearance of eddy currents when the pole pieces are made from soft iron. This disadvantage can be obviated by using materials such as sheets of silicon or soft ferrite for the production of the pole pieces. Another solution consists of placing an electromagnetic screen 9 between the antenna 8 and the pole pieces 5, 6. It is also possible to give an adapted geometry to the antenna or antennas in order to avoid electromagnetic coupling between the same and the pole pieces.

The pole pieces 5, 6 are shown in adjacent form in FIG. 1. However, this is not imperative. FIG. 2 shows a variant where the pole pieces 15, 16 are separated by a gap 10, whose value must be taken into consideration for the calculation of the shapes of the pole pieces.

FIG. 3 corresponds to a structure making it possible to obtain a higher than previous magnetic induction and therefore a better sensitivity. In this case, the direction of the magnetization is parallel to the axis of the well 1, which makes it possible to increase the length of the magnetic source and therefore the useful induction. Thus, the structure has two magnetic sources 11, 12 located in the axis of the hole 1 and whereof two poles of identical nature face one another. Each pole is provided with a pole piece. The magnetic sources 11, 12 are provided with adjacent, main pole pieces 13, 14. The other ends are provided with pole pieces 17, 18. The pole pieces 13, 14, 17 and 18 can be of soft iron, soft ferrite or silicon sheets. The pole pieces 17, 18 are not obligatory, but permit a better control of the homogeneity of the magnetic induction in the homogeneous zone 19.

If the main pole pieces 13, 14 within the structure are of ferrite, it is not necessary to place an electromagnetic screen between them and the antenna or antennas 20, 38. The external pole pieces 17, 18 can advantageously be made from soft iron for economic reasons.

The controlled induction zone 19 is toroidal. It can be a complete torus or a torus limited to an angular sector as a function of whether the main pole pieces 13, 14 are bodies of revolution about the axis of the well 1 or if they are limited to an angular sector. FIG. 3 corresponds to a logging tool centred in the well.

FIGS. 4 and 5 illustrate the case of a logging tool not centred in the well, unlike that of FIG. 3. This tool is used engaged against the well wall and can therefore be suitable for wells having different diameters. The arrangement and nature of the different elements forming this structure are identical to the structure described by FIG. 3. It is possible to see the magnetic sources 21, 22, the internal, main pole pieces 23, 24, the external pole pieces 27, 28 and the antenna or antennas 25, 39. The internal, main pole pieces 23, 24 form part of the same block also including the base or bed 26.

The configuration of the structures shown in FIGS. 4 to 6 makes it possible to obtain useful inductions of approximately 0.1 T in the zone 29 on the basis of samarium-cobalt permanent magnets for complete or sector toroidal useful volumes of rectangular section 20 mm×20 mm, for an average diameter of approximately 140 mm and with a homogeneity of a few percent.

These two types of structures make it possible to measure the relaxation time of protons excited by a high frequency signal. This signal is supplied by the h.f. antenna or antennas 25, 39, which also collect the signal reflected by the geological formation.

A high frequency antenna more particularly usable for reception, for the structures described hereinbefore, can be that shown in FIG. 6. This antenna is formed from an electrically conductive wire 30, e.g. of copper or silver, wound so as to produce a radiofrequency induction perpendicular to the static induction. The references 31 and 32 represent the two ends of the wire 30. The resulting antenna is stiffened by an amagnetic filling material and is installed in the V constituted by the association of the adjacent pole pieces. The faces 34 and 35 face the wall of the well.

FIG. 7 shows an electromagnetic screen of the type more particularly usable for the structures of FIGS. 1 and 2. This screen is produced from an electricity conducting sheet 40, e.g. of copper or silver. It is placed between the antenna and the corresponding pole pieces, in electrical contact or not with said pole pieces and adopts the shape of the latter.

In the case of the structures shown in FIGS. 3 to 5, it is possible to use an antenna, more particularly for reception, like that shown in FIG. 8. The antenna 45 is produced from an electrically conductive material, e.g. copper or silver, and reproduces the shape of the facing pole pieces. Advantageously, use is made of a perforated sheet or grating for limiting the electroacoustical effects which can produce a spurious h.f. signal. The antenna comprises a portion 46 shaped like a channel and sealed at one of its ends. To the sealing element 47 is attached a strip 48 located in the plane of symmetry of the portion 46 and reproducing its curved shape. The free end 43 of the strip 48 and the end 44 of the facing portion 46 make it possible to electrically connect the antenna to an emission and reception circuit. The antenna is stiffened by a filling material, which is e.g. an amagnetic material.

FIG. 9 shows an antenna used in particular for emission with quadratic polarization to that of the antenna 8 used for reception, because it is better coupled to the signal of the nuclei. The antenna 80 is formed from copper or silver wire wound onto a rigid support and may or may not be integrated into the antenna 8. This antenna can obviously be used only for emission and reception. It can be located inside or outside the antenna 8 and may or may not surround it.

FIG. 10 illustrates the case of a non-centred logging tool. Compared with the structure shown in FIGS. 4 and 5, this structure also has a magnetic source 85 of magnetization opposite to the direction of the initial induction in the V space. This magnetic source 85 can e.g. be constituted by a Sm-Co magnet and a pole piece 86 is associated therewith. This assembly makes it possible to place the controlled field zone more deeply in the ground, namely 30 instead of 15 mm for an induction of 0.07 T instead of 0.1 T. The geometry of the antenna or antennas 87, 88 is adapted to the new configuration. Thus, the antennas are located in the free space between the main pole pieces 23, 24 and the magnet 85-pole piece 86 assembly. This assembly is formed from metallic materials, whose presence is liable to disturb the h.f. signal due to the eddy currents which may be generated in the metals if precautions are not taken. As previously, use can be made of electromagnetic screens, namely a screen 82 for separating the magnet 85-pole piece 86 assembly from the other antennas and a screen 83 for separating the main pole pieces 23, 24 from the antennas. These screens 82, 83 can be constituted by a perforated or unperforated thin sheet or a grating of a good electrically conducting material (e.g. copper or silver).

FIG. 11 shows a logging device in a drilled well of the type corresponding to FIGS. 4 and 5. The device comprises an open magnetic structure carrying the general reference 50 and whereof all the elements have been described hereinbefore. The device also comprises an electromagnetic circuit 51, which is a circuit conventionally used in logging operations. It is connected on the one hand to the antenna of the structure 50 and on the other to an electric cable 53 by means of the connector 51. The cable 53 makes it possible to electrically connect the logging device to surface installations and also supports the device. An amagnetic mechanical support 54 maintains the open magnetic structure 50 and the electronic circuit 51 and with the amagnetic sheath 55 forms the envelope of the device, which is consequently made tight to the mud in the well 1. An amagnetic shoe 56 makes it possible to engage the magnetic structure 50 against the well wall. The open magnetic structure according to the invention can also be used in surface magnetic imaging. This imaging involves an induction homogeneity or uniformity of a few dozen parts per million, so that induction correction coils must be used. It also involves the description of the volume to be observed in such a way that the induction value corresponds to the resonance value in a given elementary volume, which gives the resolution. This is generally brought about by using magnetic induction gradients in the three directions in space s, y and z.

FIG. 12 shows a configuration for surface magnetic imaging. The device comprises a magnetic source 60 constituted by a permanent magnet. Two pole pieces 61, 62 are fixed to one of the poles of the magnetic source 60. The shape of these pole pieces is defined, as hereinbefore, for obtaining the desired uniformity of the induction. In the V formed by the pole pieces 61, 62 is installed the antenna or antennas 63, the conventional induction correction coils 65 and gradient coils 64, as well as the magnetic source 66 associated with an induction correction pole piece. The geometry of the assembly can be parallelepipedic or cylindrical with or without a counter-pole piece, like the pole piece 67, of varied geometry.

The induction correction magnetic source 66 can be of samarium-cobalt, neodymium-iron-boron or hard ferrite. The associated pole piece can be of soft iron, silicon-iron or ferrite.

A cap 68 made from an amagnetic, electrically insulating material (e.g. a glass-epoxy resin composite) covers that portion of the structure having the pole pieces 61,62. The coils 64 make it possible to obtain induction gradients in directions x, y and z. The obtaining of the gradient in accordance with the z axis is the most difficult. A mechanical sweep solution along axis z consists of displacing the magnetic structure with respect to the volume to be observed. The displacement of the magnetic structure then takes place along the magnetization axis of the magnetic source 60.

Inductions of approximately 0.03 to 0.12 T can be obtained from magnetic sources constituted by permanent magnets such as of hard ferrite, samarium-cobalt or neodymium-iron-boron for useful volumes centred at 15 mm from the end of the pole pieces and of section 20 mm×20 mm for parallelepipedic systems, and for cylindrical volumes 20 mm base diameter and 20 mm height.

FIG. 13 shows a surface magnetic imaging means, where it is possible to see, forming the imager head 71, the magnetic source 60, the pole pieces 61, 62, the antenna 63, the gradient coils 64, the induction correction coils 65 and the induction correction magnetic source 66 associated with its pole piece. In this example, the counter-pole piece 69 has a shape different from that of FIG. 10. The device has a mechanical support 70 for holding the head 71, which can be made orientable by a ball joint 72.

A known displacement mechanism 73 permits the longitudinal displacement of the magnetic structure along the axis z within the cap 68. The orientable head 71 is connected by means of an electric cable 74 to electronic apparatus 75 conventionally used for controlling the imager.

We claim:

1. Open magnetic structure for producing an intense, stable magnetic field, which is controlled in amplitude and direction in a region adjacent to said structure, having at least one magnetic source (4) for producing said magnetic field, comprising one or more pole pieces (5, 6) associated with the magnetic source and having a shape designed so as to control the magnetic field produced, the said pole piece or pieces for controlling said magnetic field produced having a hollow portion constituting a generally V-shaped space, said region subject to the homogeneous magnetic field being positioned facing the opening of the V.

2. Structure according to claim 1, comprising at least one pole piece (13, 17, 14, 18) per pole of the magnetic source (11, 12).

3. Structure according to claim 1, comprising two aligned magnetic sources (11, 12), two poles of the same nature being positioned facing one another, each of said two poles being provided with a pole piece (13, 14) called the internal main pole piece for producing said controlled magnetic field, said internal main pole pieces being separated by said V-shaped space.

4. Structure according to claim 1, comprising two aligned magnetic sources (21, 22), two poles of the same nature facing one another, each of the said two poles being provided with a pole piece (23, 24) known as the internal main pole piece, said internal main pole pieces being separated by said V-shaped space, an auxiliary, magnetic polarization source (85) not aligned with the two aligned magnetic sources (21, 22) being situated in the V-shaped space, said internal, main pole pieces (23, 24) and the auxiliary magnetic source (85) producing a controlled magnetic field in said region, which faces the opening of the V.

5. Structure according to claim 4, wherein a pole piece (86) is associated with the auxiliary magnetic source (85) and has a shape designed so as to control the magnetic field produced.

6. Device permitting the analysis of a given region adjacent to the device by means of magnetic field, comprising an open magnetic structure having at least one magnetic source (4) for producing said magnetic field, one or more pole pieces (5, 6) associated with the magnetic source and having a shape designed so as to control the magnetic field produced, the one or more pole pieces having a hollow portion constituting a generally V-shaped space for producing an intense, static, homogeneous magnetic field in said given region, and means (8, 20, 25, 37, 38, 39, 63, 87, 88) permitting the emission of an electromagnetic signal to said given region and the reception of the response signal from said given region to the emitted signal.

7. Device according to claim 6, wherein the emission and reception means are constituted by at least one antenna placed in said V-shaped space.

8. Device according to claim 6, wherein the antenna is formed from an electrically conductive wire (30) and is stiffened by an amagnetic material.

9. Device according to claim 7, wherein the antenna (50) is formed from a channel-shaped portion (46) closed at one of its ends by an element (47), to which is connected a strip (48), the free end (44) of the channel and the free end (43) of the strip forming the electrical connections of the antenna.

10. Device according to claim 6, comprising an electromagnetic screen (9, 82, 83) between the antenna (8, 87, 88) and the adjacent pole piece or pieces (5, 6, 23, 24, 86).

11. Device according to claim 10, wherein the electromagnetic screen is formed from an electrically conductive sheet (40).

12. Device according to claim 6, wherein, for use as a surface magnetic imaging device, it comprises in the V-shaped space, gradient coils (64) for the directions in space x, y and possibly z, z being the direction of the homogeneous magnetic field in the given region.

13. Device according to claim 12, wherein means (65, 66) for correcting the magnetic induction in the given region, said correction means being located in the V-shaped space.

14. Device according to claim 12, further comprising means (73) for the displacement of the magnetic structure for producing the induction gradient in the direction z.

15. Structure according to claim 2, further comprising two aligned magnetic sources (11, 12), two poles of the same nature being positioned facing one another, each of said two poles being provided with a pole piece (13, 14) called the internal main pole piece for producing said controlled magnetic field, said internal main pole pieces being separated by said V-shaped space.

16. Structure according to claim 2, further comprising two aligned magnetic sources (21, 22), two poles of the same nature facing one another, each of the said two poles being provided with a pole piece (23, 24) known as the internal main pole piece, said internal main pole pieces being separated by said V-shaped space, an auxiliary, magnetic polarization source (85) not aligned with the two aligned magnetic sources (21, 22) being situated in the V-shaped space, said internal, main pole pieces (23, 24) and the auxiliary magnetic source (85) producing a controlled magnetic field in said region, which faces the opening of the V.

17. Device permitting the analysis of a given region by means of magnetic field, comprising a structure according to claim 5 for producing an intense, static, homogeneous magnetic field in said given region, and means (8, 20, 25, 37, 38, 39, 63, 87, 88) permitting the emission of an electromagnetic signal to said given region and the reception of the response signal from said given region to the emitted signal.

18. Device according to claim 9, further comprising an electromagnetic screen (9, 82, 83) between the antenna (8, 87, 88) and the adjacent pole piece or pieces (5, 6, 23, 24, 86) and optionally said auxiliary magnetic source (85).

19. Device according to claim 11, wherein, for use as a surface magnetic imaging device, it comprises in the V-shaped space, gradient coils (64) for the directions in space x, y and possibly z, z being the direction of the homogeneous magnetic field in the given region.

20. Device according to claim 13, further comprising means (73) for the displacement of the magnetic structure for producing the induction gradient in the direction z.

21. Device according to claim 6, characterized in that it comprises an electromagnetic screen (9, 82, 83) between the antenna (8, 87, 88) and the adjacent pole piece or pieces (5, 6, 23, 24, 86) and said auxiliary magnetic source (85).

22. Device permitting the analysis of a given region by means of magnetic field, comprising an open magnetic structure having at least one magnetic source (4) for producing said magnetic field, one or more pole pieces (5, 6) associated with the magnetic source and having a shape designed so as to control the magnetic field produced, the one or more pole pieces having a hollow portion constituting a generally V-shaped space for producing an intense, static, homogeneous magnetic field in said given region, and means (8, 20, 25, 37, 38, 39, 63, 87, 88) comprising at least one antenna placed in the generally V-shaped space for permitting the emission of an electromagnetic signal to said given region and the reception of the response signal from said given region to the emitted signal, the at least one antenna comprising a channel-shaped portion closed at one of its ends by an element, to which is connected a strip, the free end of the channel and the free end of the strip forming the electrical connections of the antenna.

23. The device of claim 22 further comprising an electromagnetic screen between the antenna and the adjacent one or more pole pieces and optionally an auxiliary magnetic source.

* * * * *